(12) United States Patent  (10) Patent No.: US 8,884,560 B2
Ito  (45) Date of Patent: Nov. 11, 2014

(54) INVERTER DEVICE AND AIR CONDITIONER INCLUDING THE SAME

(75) Inventor: Norikazu Ito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 177 days.

(21) Appl. No.: 13/604,892

(22) Filed: Sep. 6, 2012

(65) Prior Publication Data

US 2013/0133358 A1    May 30, 2013

(30) Foreign Application Priority Data

Nov. 25, 2011  (JP) ................................ 2011-257386

(51) Int. Cl.
    *H02P 6/14*    (2006.01)
(52) U.S. Cl.
    USPC .................. 318/400.26; 318/400.01; 318/700
(58) Field of Classification Search
    USPC .................................. 318/400.01, 400.26, 700
    See application file for complete search history.

(56) References Cited

U.S. PATENT DOCUMENTS

| 6,353,543 | B2 * | 3/2002 | Itoh et al. .................... 363/21.01 |
| 2010/0065245 | A1 * | 3/2010 | Imada et al. ..................... 165/59 |
| 2010/0251742 | A1 * | 10/2010 | Tucker et al. ................ 62/324.6 |

FOREIGN PATENT DOCUMENTS

| JP | 04354156 A | * | 12/1992 |
| JP | H09-172359 A | | 6/1997 |
| JP | H10-022801 A | | 1/1998 |
| JP | 10209832 A | * | 8/1998 |
| JP | 2006-020405 A | | 1/2006 |
| JP | 2007-166766 A | | 6/2007 |
| JP | 2009-055781 A | | 3/2009 |
| JP | 2010-161846 A | | 7/2010 |
| WO | WO 00/72433 A1 | | 11/2000 |
| WO | WO 01/20757 A1 | | 3/2001 |

OTHER PUBLICATIONS

Machine translation WO 00/72433 A1.*
Office action mailed Nov. 26, 2013 in the corresponding JP application No. 2011-257386 (and partial English translation).
Office Action issued Sep. 13, 2013 in the corresponding Australian application No. 2012254876.
Extended European Search Report dated Jul. 4, 2014 issued in the corresponding EP patent application No. 12190706.7.
Office Action dated Aug. 5, 2014 issued in corresponding CN patent application No. 201210475309.7 (and English translation).

* cited by examiner

*Primary Examiner* — Kawing Chan
(74) *Attorney, Agent, or Firm* — Posz Law Group, PLC

(57) ABSTRACT

An inverter device includes a plurality of switching circuits in which first switching elements including Si semiconductors and second switching element including WBG semiconductors having ON resistance smaller than that of the first switching elements and having switching speed higher than that of the first switching elements are connected in parallel. The inverter device includes a converting circuit that converts a direct-current voltage into a desired alternating-current voltage and a driving unit that generates a plurality of driving signals for respectively turning on and off the switching circuits. The inverter device includes, for each of the switching circuits, a gate circuit that, based on the driving signals, turns on the second switching element later than the first switching element and turns off the first switching element later than the second switching element.

7 Claims, 3 Drawing Sheets

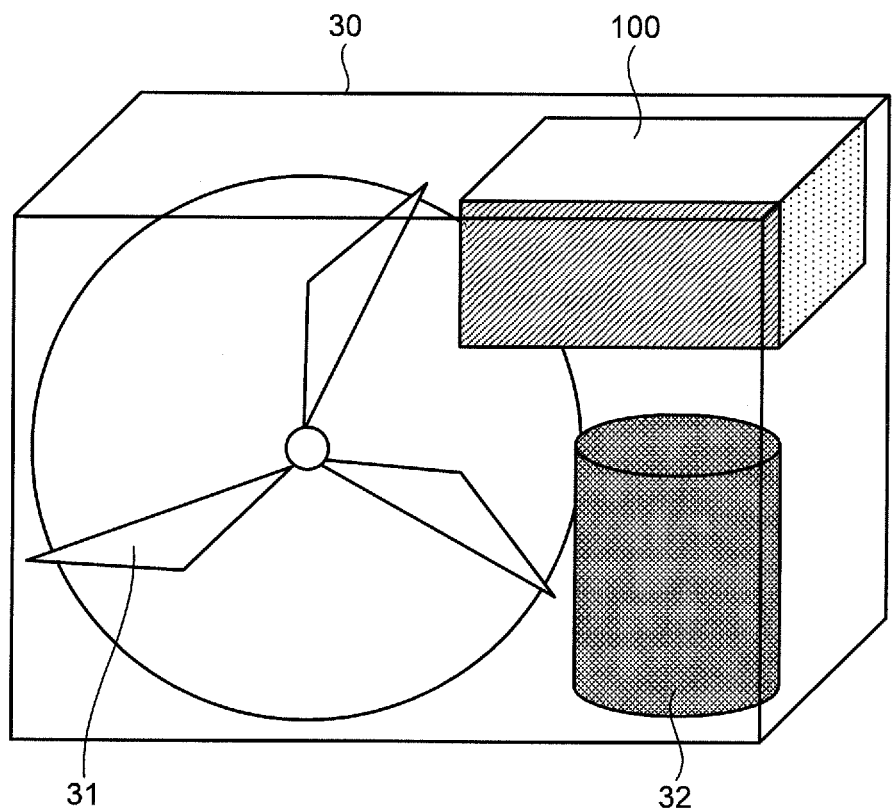

INVERTER DEVICE AND AIR CONDITIONER INCLUDING THE SAME

BACKGROUND OF THE INVENTION

1. Field of the Invention

The present invention relates to an inverter device and an air conditioner including the inverter device.

2. Description of the Related Art

In the past, for example, International Patent Publication No. 2000-072433 discloses a technology for realizing a reduction in an energization loss of an entire switching circuit by configuring, as a switching circuit included in an inverter device, a parallel circuit in which a Si transistor and a non-Si transistor including a SiC or GaN semiconductor are connected in parallel and for realizing a reduction in a switching loss by simultaneously raising a gate voltage of the Si transistor and a gate voltage of the non-Si transistor.

Further, for example, International Patent Publication No. 2001-020757 discloses a technology for reducing a conduction loss and a switching loss by connecting in parallel a main transistor including a current-driven semiconductor switching element having a small conduction loss and an auxiliary transistor including a voltage-driven semiconductor element having switching speed higher than that of the current-driven semiconductor switching element to configure a main switch and turning on the auxiliary transistor earlier than the main transistor and turning off the auxiliary transistor later than the main transistor.

However, in the technology disclosed in International Patent Publication No. 2000-072433, the switching circuit is turned on by the non-Si transistor including the SiC or GaN semiconductor element having high switching speed during turn-on. Therefore, the non-Si transistor having a large current capacity needs to be used. As a result, the price of the non-Si transistor more expensive than the Si semiconductor element further rises. In the technology disclosed in International Patent Publication No. 2001-020757, driving signals for driving the main transistor and the auxiliary transistor are supplied independently from each other. Therefore, when the inverter device is configured, driving signals twice as many as normal driving signals are necessary. As a result, a driving control circuit cannot be configured using a general-purpose device and the price of the driving control circuit rises.

The present invention has been devised in view of the above and it is an object of the present invention to provide an inverter device that can realize a further reduction in costs while enjoying a loss reduction effect and an air conditioner including the inverter device.

SUMMARY OF THE INVENTION

It is an object of the present invention to at least partially solve the problems in the conventional technology.

There is provided an inverter device including: a rectifying circuit configured to rectify an alternating-current voltage output from an alternating-current power supply into a direct-current voltage; a smoothing capacitor configured to smooth the direct-current voltage rectified by the rectifying circuit; a converting circuit configured to convert the direct-current voltage smoothed by the smoothing capacitor into a desired alternating-current voltage; and a control unit configured to control the converting circuit, wherein the converting circuit includes a plurality of switching circuits each including: a first switching element; and a second switching element connecting in parallel with the first switching element, having a conduction loss smaller than that of the first switching element and having switching speed higher than that of the first switching element, and the control unit includes: a driving unit configured to generate a plurality of driving signals for respectively driving the switching circuits to be turned on and off; and a gate circuit configured to, for each of the switching circuits, based on the driving signals, turn on the second switching element later than the first switching element and turn off the first switching element later than the second switching element.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a configuration schematic diagram of an outdoor unit of an air conditioner according to a third embodiment.

DETAILED DESCRIPTION OF THE PREFERRED EMBODIMENTS

An inverter device and an air conditioner including the inverter device according to embodiments of the present invention are explained below with reference to the accompanying drawings. The present invention is not limited by the embodiments explained below.

First Embodiment

Figure 1:
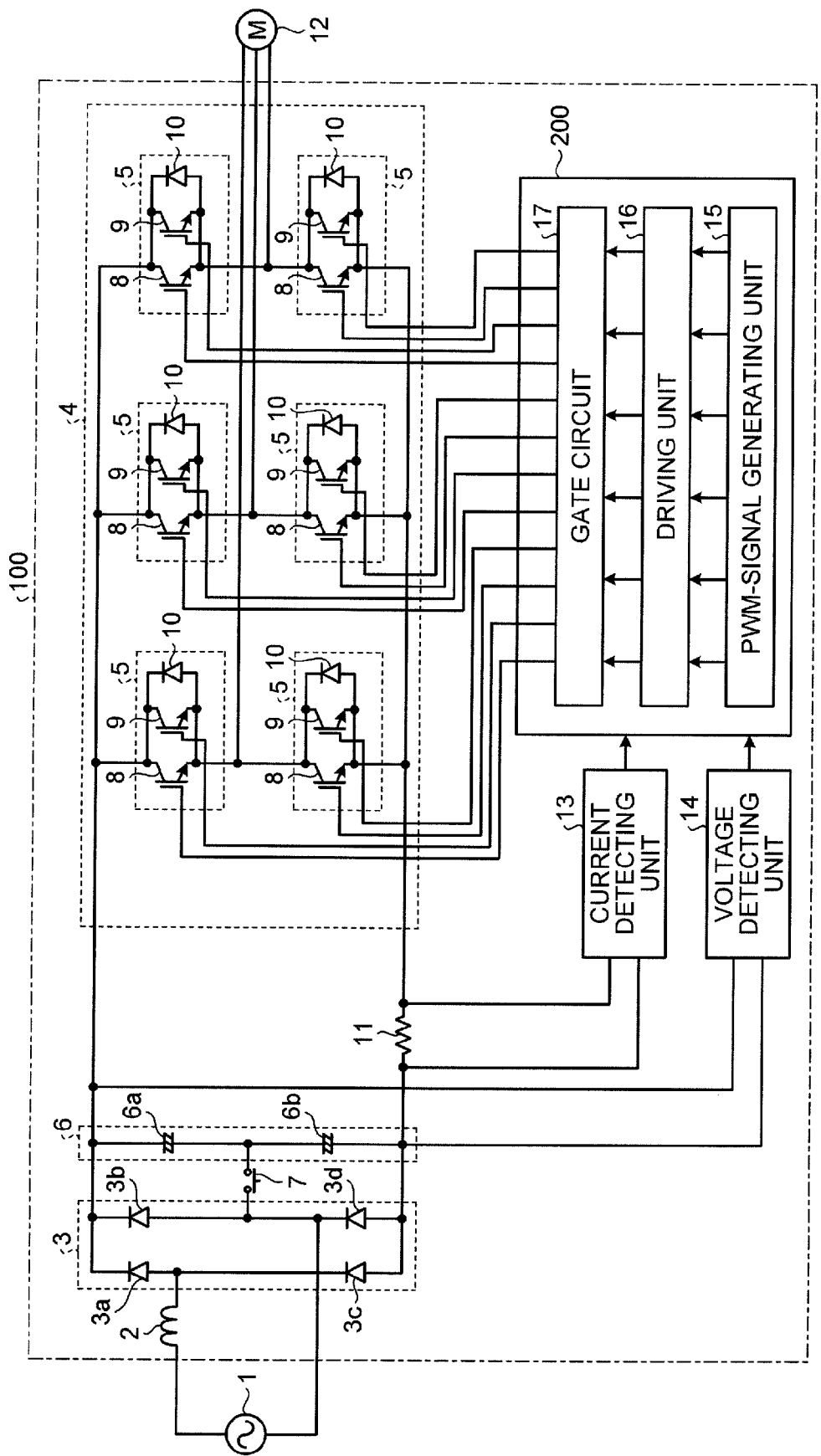
FIG. 1 is a diagram of a configuration example of an inverter device according to a first embodiment.

FIG. 1 is a diagram of a configuration example of an inverter device according to a first embodiment. As shown in FIG. 1, an inverter device 100 according to the first embodiment includes a reactor 2 for power factor improvement, a diode bridge (a rectifying circuit) 3 that rectifies an alternating-current voltage output from an alternating-current power supply 1 via the reactor 2, a smoothing capacitor 6 that smoothes a direct-current voltage rectified by the diode bridge 3, a converting circuit 4 that converts the direct-current voltage smoothed by the smoothing capacitor 6 into a desired alternating-current voltage, a current detecting unit 13 that detects an electric current flowing to a resistor 11 to thereby detect a circuit current flowing to the converting circuit 4, a voltage detecting unit 14 that detects a voltage across both ends of the smoothing capacitor 6 to thereby detect a direct-current voltage applied to the converting circuit 4, and a control unit 200 that controls the converting circuit 4.

The diode bridge 3 includes diodes 3a, 3b, 3c, and 3d. In the example shown in FIG. 1, the smoothing capacitor 6 includes smoothing capacitors 6a and 6b connected in series. The smoothing capacitor 6 is configured to be capable of switching full-wave rectification and half-wave rectification according to an open and close state of a switch 7 connected between one end of the alternating-current power supply 1 and a middle point of the smoothing capacitors 6a and 6b. In the example shown in FIG. 1, the alternating-current power supply 1 is a single-phase alternating-current supply. However, the alternating-current power supply 1 is not limited to this and can be a three-phase alternating-current power supply. In this case, the diode bridge 3 only has to be configured to rectify a three-phase alternating-current voltage.

In the example shown in FIG. 1, a three-phase motor 12 is driven as a load of the converting circuit 4. In this case, the converting circuit 4 is configured by connecting, for each of phases, two switching circuits 5 in series via the resistor 11 between a positive electrode side and a negative electrode side of the smoothing capacitor 6. The configuration of the converting circuit 4 is not limited to this. The converting circuit 4 can be configured to drive a single-phase motor.

The converting circuit 4 includes a plurality of switching circuits 5 in which first switching elements 8, second switching elements 9, and freewheeling diodes 10 are connected in parallel.

In this embodiment, as the first switching element 8, for example, a voltage-driven semiconductor element such as an IGBT or a MOSFET including a silicon (Si) semiconductor is used. As the second switching element 9, for example, a voltage-driven semiconductor element such as an IGBT or a MOSFET including a wideband gap (hereinafter referred to as "WBG") semiconductor such as silicon carbide (SiC) or gallium nitride (GaN) material or diamond is used. The second switching element 9 including the WBG semiconductor has a characteristic that ON resistance is smaller than that of the first switching element 8 including the Si semiconductor and switching speed is higher than that of the first switching element 8.

The control unit 200 includes a PWM-signal generating unit 15, a driving unit 16, and a gate circuit 17.

The PWM-signal generating unit 15 performs motor driving control using pulse width modulation (PWM). In this embodiment, the PWM-signal generating unit 15 generates PWM signals, which are the source of driving signals for driving the switching circuits 5, based on a circuit current flowing to the converting circuit 4 detected by the current detecting unit 13 and a direct-current voltage applied to the converting circuit 4 detected by the voltage detecting unit 14.

The driving unit 16 generates, based on the PWM signals, the driving signals for driving the switching circuits 5 and outputs the driving signals to the gate circuit 17. The PWM-signal generating unit 15 and the driving unit 16 can be different devices or can be configured as one device.

Figure 2:
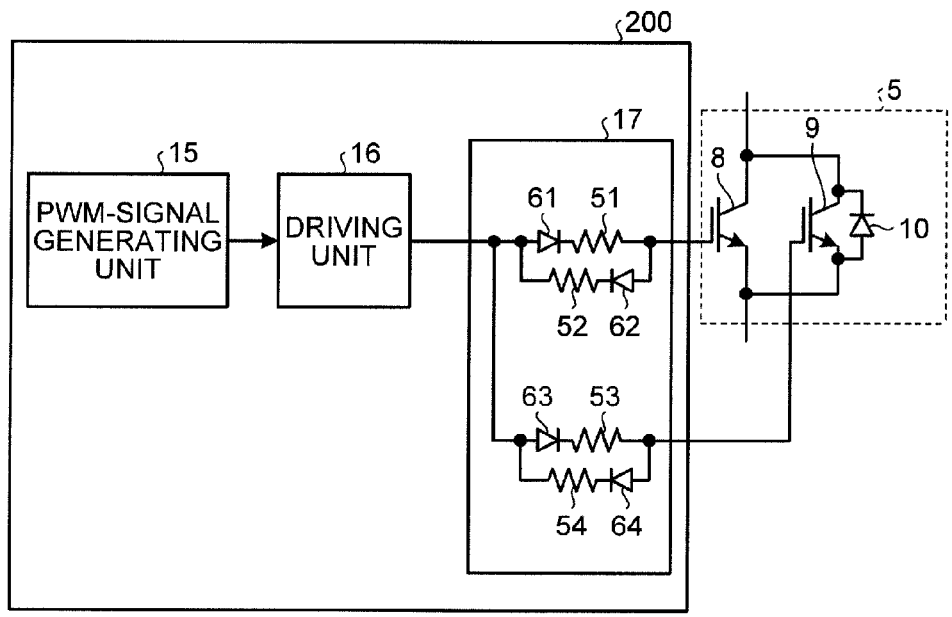
FIG. 2 is a diagram of a configuration example of a gate circuit in the inverter device according to the first embodiment.

The gate circuit 17 turns on and off the first switching elements 8 and the second switching elements 9 in the switching circuits 5 based on the driving signals. FIG. 2 is diagram of a configuration example of the gate circuit in the inverter device according to the first embodiment. As shown in FIG. 2, the gate circuit 17 includes, for each of the switching circuits 5, a first diode 61 and a first resistor 51 connected in series in a direction in which an electric current flows from the driving unit 16 to a gate terminal (a control terminal) of the first switching element 8, a second diode 62 and a second resistor 52 connected in series in a direction in which an electric current flows from the gate terminal of the first switching element 8 to the driving unit 16, a third diode 63 and a third resistor 53 connected in series in a direction in which an electric current flows from the driving unit 16 to a gate terminal of the second switching element 9, and a fourth diode 64 and a fourth resistor 54 connected in series in a direction in which an electric current flows from the gate terminal of the second switching element 9 to the driving unit 16. In this embodiment, the resistance of the first resistor 51 is set to a value smaller than the resistance of the third resistor 53. The resistance of the second resistor 52 is set to a value larger than the resistance of the fourth resistor 54.

The operation of the switching circuits 5 in the inverter device 100 according to the first embodiment is explained.

In this embodiment, one driving signal is input to the gate circuit 17 for the switching circuits 5 in which the first switching elements 8 and the second switching elements 9 are connected in parallel. In other words, it is unnecessary to independently supply a driving signal to each of the first switching elements 8 and the second switching elements 9 of the switching circuits 5. Therefore, it is possible to configure the PWM-signal generating unit 15 and the driving unit 16 using an inexpensive general-purpose device.

The first switching element 8 and the second switching element 9 have parasitic capacitances between gate terminals and collector terminals (input terminals: in the case of a MOSFET, drain terminals). Therefore, during rising of a driving signal input to the gate circuit 17, a time constant circuit of the first resistor 51 and the parasitic capacitance between the gate and the collector of the first switching element 8 and a time constant circuit of the third resistor 53 and the parasitic capacitance between the gate and the collector of the second switching element 9 are configured. In this embodiment, the resistance of the first resistor 51 is set to a value smaller than the resistance of the third resistor 53. Therefore, the first switching element 8 is turned on earlier and the second switching element 9 is turned on later.

On the other hand, during falling of the driving signal input to the gate circuit 17, a time constant circuit of the second resistor 52 and the parasitic capacitance between the gate and the collector of the first switching element 8 and a time constant of the fourth resistor 54 and the parasitic capacitance between the gate and the collector of the second switching element 9 are configured. In this embodiment, the resistance of the second resistor 52 is set to a value larger than the resistor of the fourth resistor 54. Therefore, the first switching element 8 is turned on later than the second switching element 9.

In other words, the switching circuit 5 is turned on and off by the first switching element 8. The second switching element 9 is turned on and off in a state in which the first switching element 8 is off. Therefore, a switching loss by the second switching element 9 is extremely small. Therefore, even if the second switching element 9 is configured by an expensive WBG semiconductor, a device having a small current capacity can be used. Consequently, costs can be reduced to be smaller than costs required when a converting circuit is configured using only a switching element including the WBG semiconductor.

The switching circuit 5 is turned on and off by the first switching element 8 including the Si semiconductor. Therefore, a switching loss is larger than a switching loss that occurs when the converting circuit is configured by using only the switching element including the WBG semiconductor. The switching loss is equivalent to a switching loss that occurs when a converting circuit is configured by using only a switching element including the Si semiconductor. However, in a period in which the second switching element 9 including the WBG semiconductor is on, most of an electric current flowing in the switching circuit 5 flows to the second switching element 9. Therefore, a conduction loss can be reduced to be smaller than a conduction loss that occurs when the converting circuit is configured by using only the switching element including the Si semiconductor.

As explained above, with the inverter device according to the first embodiment, the first switching element and the second switching element having the ON resistance smaller than that of the first switching element and having the switching speed higher than that of the first switching element are connected in parallel to configure the switching circuit. The second switching element is turned on later than the first switching element. The first switching element is turned off later than the second switching element. Therefore, because the second switching element is turned on and off in a state in which the first switching element is off, a switching loss by the second switching element is extremely small. Therefore, even when the second switching element includes the expensive WBG semiconductor, a device having small current capacity can be used. Consequently, costs can be reduced to be smaller than costs required when the converting circuit is configured by using only the switching element including the WBG semiconductor.

In general, when a switching element having high switching speed is used, switching noise that occurs during turn-on and during turn-off of the switching element increases. However, in this embodiment, turn-on and turn-off of the switching element are carried out by the first switching element including the Si semiconductor having the switching speed lower than that of the second switching element including the WBG semiconductor. Therefore, switching noise can be further suppressed than switching noise that occurs when the converting circuit is configured by using only the switching element including the WBG semiconductor.

The switching circuits in which the first switching elements and the second switching elements are connected in parallel are driven by one driving signal. Therefore, it is unnecessary to independently supply a driving signal to each of the first switching elements and the second switching elements of the switching circuits. Consequently, it is possible to configure the PWM-signal generating unit and the driving unit using an inexpensive general-purpose device.

The switching circuit is turned on and off by the first switching element including the Si semiconductor. Therefore, a switching loss is larger than a switching loss that occurs when the converting circuit is configured by using only the switching element including the WBG semiconductor. The switching loss is equivalent to a switching loss that occurs when the converting circuit is configured by using only the switching element including the Si semiconductor. However, in a period in which the second switching element including the WBG semiconductor is on, most of an electric current flowing in the switching circuit flows to the second switching element. Therefore, a conduction loss can be reduced to be smaller than a conduction loss that occurs when the converting circuit is configured by using only the switching element including the Si semiconductor.

Second Embodiment

In an example explained in a second embodiment, only a second switching element including a WBG semiconductor is turned on and off in a low-load state. The low-load state means, for example, a state in which a compressor motor is actuated with a low load different from a load during a normal operation of the compressor motor, for example, when a dormant refrigerant in the compressor motor under suspension is prevented by restrictively energizing a motor winding to prevent the compressor motor connected as a load of a converting circuit from rotating.

Figure 3:
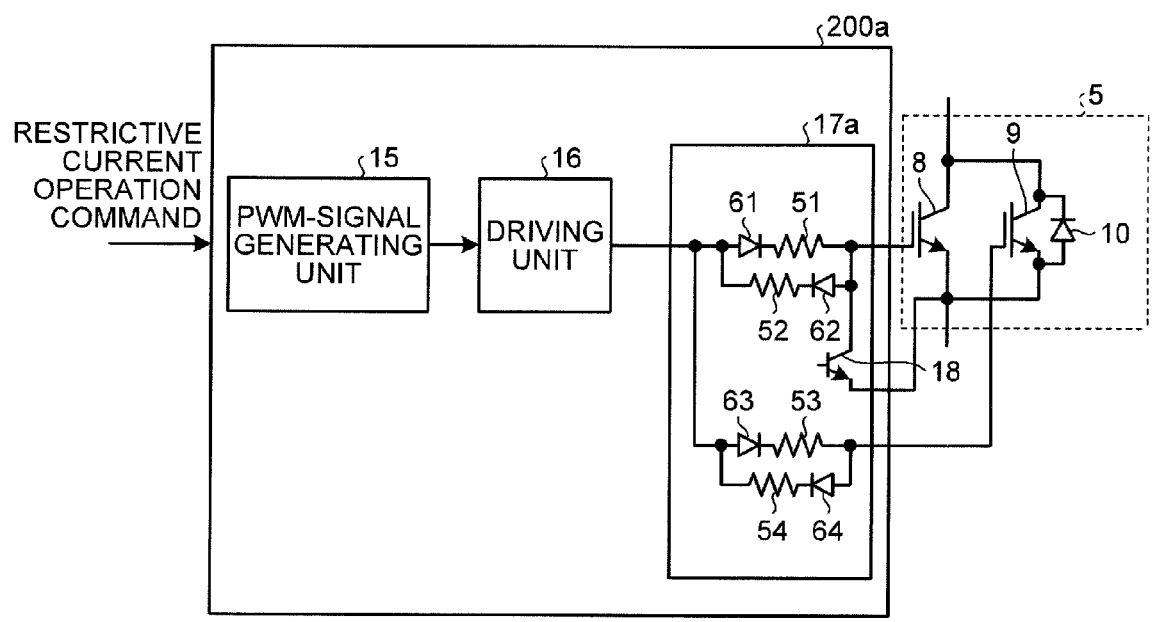
FIG. 3 is a diagram of a configuration example of a gate circuit in an inverter device according to a second embodiment.

FIG. 3 is a diagram of a configuration example of a gate circuit in an inverter device according to the second embodiment. An overall configuration of the inverter device 100 according to the second embodiment is the same as that of the inverter device according to the first embodiment. Therefore, components same as or equivalent to those in the first embodiment are denoted by the same reference numerals and signs and detailed explanation of the components is omitted.

As shown in FIG. 3, a control unit 200a of the inverter device 100 according to the second embodiment includes, instead of the gate circuit 17 explained in the first embodiment, a gate circuit 17a further including a transistor 18 that causes a short-circuit between a gate terminal and an emitter terminal (an output terminal: a source terminal in the case of a MOSFET) of the first switching element 8.

An operation performed when a load connected to the converting circuit 4 is in a low-load state different from a state in normal time in the inverter device 100 according to the second embodiment is explained. In the following explanation, as an example of the operation performed when the load connected to the converting circuit 4 is in the low-load state different from the state in the normal time, restrictive energization of the three-phase motor 12 for compressor driving is carried out.

When a restrictive energization operation command is input from the outside, the control unit 200a controls the transistor 18 in the gate circuit 17a to be turned on and causes a short-circuit between the gate terminal and the emitter terminal of the first switching element 8. The control unit 200a thereby stops turning on and off the first switching element 8 and turns on and off only the second switching element 9.

When the load connected to the converting circuit 4 is in the low-load state different from the state in the normal time, for example, when the restrictive energization of the three-phase motor 12 is carried out, an electric current flowing to the switching circuits 5 is smaller than that in the normal time. Therefore, only the second switching element having small ON resistance and high switching speed is turned on and off. Consequently, it is possible to further reduce a switching loss and a conduction loss of the switching circuit 5.

Because the switching loss is reduced, a carrier frequency in PWM control can be set higher than that in the normal time. Therefore, noise caused by a motor during the restrictive energization can be removed from an audible band by stopping the first switching element 8 being turned on and off and setting the carrier frequency of the PWM signal higher than that during the normal operation (e.g., equal to or higher than 20 kilohertz). Further, a magnetic flux generated in the motor winding can be intensified by setting the carrier frequency high. Therefore, it is possible to not only heat the motor winding but also heat a core of the motor with the magnetic flux generated in the motor winding.

As explained above, with the inverter device according to the second embodiment, when the load connected to the converting circuit is in the low-load state different from the state in the normal time, the first switching element is stopped being turned on and off and only the second switching element having ON resistance smaller than that of the first switching element and having switching speed higher than that of the first switching element is turned on and off. Therefore, it is possible to further reduce a switching loss and a conduction loss of the switching circuit in the low-load state.

Because the switching loss of the switching circuit is reduced, the carrier frequency in the PWM control can be set higher than that in the normal time. For example, when the switching circuit is used for a rotational operation of the compressor motor, in carrying out the restrictive energization of the compressor motor, noise caused by the motor during the restrictive energization can be removed from the audible band by setting the carrier frequency of the PWM signal higher than that during the normal operation (e.g., equal to or higher than 20 kilohertz). Further, a magnetic flux generated in the motor winding can be intensified by setting the carrier frequency high. Therefore, it is possible to not only heat the motor winding but also heat the core of the motor with the magnetic flux generated in the motor winding.

Third Embodiment

In an example explained in a third embodiment, the inverter device explained in the first and second embodiments is applied to an air conditioner. FIG. 4 is a configuration schematic diagram of an outdoor unit of the air conditioner according to the third embodiment.

As shown in FIG. 4, an outdoor unit 30 of the air conditioner according to the third embodiment includes a fan 31 for facilitating heat exchange between an outdoor heat exchanger (not shown in the figure) and the outdoor air, a compressor 32 that circulates a compressed refrigerant to a refrigerant circuit (not shown in the figure) in the air conditioner, and the inverter device 100 according to the first or second embodiment.

In the example shown in FIG. 4, the inverter device 100 is set in an upper part of the outdoor unit 30. The inverter device 100 controls a rotational operation of a compressor motor included in the compressor 32. The inverter device 100 is not limited to be used for the control of the rotational operation of the compressor motor included in the compressor 32. For example, the inverter device 100 may control a rotational operation of a motor that drives the fan 31 and a ventilation fan (not shown in the figure) in the indoor unit (not shown in the figure).

As explained above, with the air conditioner according to the third embodiment, because the inverter device explained in the first embodiment is applied, the first switching element and the second switching element having the ON resistance smaller than that of the first switching element and having the switching speed higher than that of the first switching element are connected in parallel to configure the switching circuit. The second switching element is turned on later than the first switching element. The first switching element is turned off later than the second switching element. Therefore, even when the second switching element is configured to include the expensive WBG semiconductor, a device having small current capacity can be used. Consequently, costs can be reduced compared with costs of an inverter device in which only the switching element including the WBG semiconductor is used.

The switching circuits in which the first switching elements and the second switching elements are connected in parallel are driven by one driving signal. Therefore, the control unit or the driving unit can be configured using an inexpensive general-purpose device. Consequently, it is possible to reduce costs to be smaller than costs required when the inverter device having the same configuration including the two switching elements connected in parallel is used.

The switching circuit is turned on and off by the first switching element including the Si semiconductor. Therefore, a switching loss is equivalent to a switching loss caused when the inverter device including the converting circuit configured by using only the switching element including the Si semiconductor is used. However, in a period in which the second switching element including the WBG semiconductor is on, most of an electric current flowing in the switching circuit flows to the second switching element. Therefore, a conduction loss can be reduced to be smaller than a conduction loss caused when the inverter device including the converting circuit configured by using only the switching element including the Si semiconductor is used.

Because the inverter device explained in the second embodiment is applied to the air conditioner, when the load connected to the converting circuit is in the low-load state different from the state in the normal time, the first switching element is stopped being turned on and off and only the second switching element having ON resistance smaller than that of the first switching element and having switching speed higher than that of the first switching element is turned on and off. Therefore, it is possible to further reduce a loss in the low-load state to be smaller than a loss in the low-load state caused when the inverter device having the same configuration including the two switching elements connected in parallel is used.

For example, when the inverter device explained in the second embodiment is applied to the rotational operation of the compressor motor, the carrier frequency in the PWM control can be set higher than that in the normal time. Therefore, when the restrictive energization of the compressor motor is carried out, noise caused by the motor during the restrictive energization can be removed from the audible band by setting the carrier frequency of the PWM signal higher than that during the normal operation (e.g., equal to or higher than 20 kilohertz). Further, a magnetic flux generated in the motor winding can be intensified by setting the carrier frequency high. Therefore, it is possible to not only heat the motor winding but also heat the core of the motor with the magnetic flux generated in the motor winding. Consequently, it is possible to efficiently prevent a dormant refrigerant in the compressor motor under suspension.

Effects obtained by using the switching element including the WBG semiconductor explained in the embodiments are not limited to the effects described in the embodiments.

For example, the switching element including the WBG semiconductor has a high withstanding voltage and a high allowable current density. Therefore, it is possible to reduce the size of switching elements. By using the switching elements reduced in the size, it is possible to reduce the size of an inverter circuit incorporating the elements.

The switching element including the WBG semiconductor has high heat resistance as well. Therefore, because a heat radiation fin of a heat sink can be reduced in size, it is possible to further reduce the size of an inverter circuit.

According to the present invention, there is an effect that it is possible to realize a further reduction in costs while enjoying a loss reduction effect.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An inverter device comprising:
 a rectifying circuit configured to rectify an alternating-current voltage output from an alternating-current power supply into a direct-current voltage;
 a smoothing capacitor configured to smooth the direct-current voltage rectified by the rectifying circuit;
 a converting circuit configured to convert the direct-current voltage smoothed by the smoothing capacitor into a desired alternating-current voltage; and
 a control unit configured to control the converting circuit, wherein
 the converting circuit includes a plurality of switching circuits each including:
  a first switching element; and
  a second switching element connecting in parallel with the first switching element, having a conduction loss smaller than that of the first switching element and having switching speed higher than that of the first switching element, and the control unit includes:
- a driving unit configured to generate a plurality of driving signals for respectively driving the switching circuits to be turned on and off; and
- a gate circuit configured to drive each of the switching circuits based on a corresponding one of the driving signals to turn on the second switching element later than the first switching element and turn off the first switching element later than the second switching element.

2. The inverter device according to claim 1, wherein the gate circuit includes, for each of the switching circuits:
- a first diode and a first resistor connected in series in a direction in which an electric current flows from the driving unit to a control terminal of the first switching element;
- a second diode and a second resistor connected in series in a direction in which an electric current flows from the control terminal of the first switching element to the driving unit;
- a third diode and a third resistor connected in series in a direction in which an electric current flows from the driving unit to a control terminal of the second switching element; wherein
- a fourth diode and a fourth resistor connected in series in a direction in which an electric current flows from the control terminal of the second switching circuit to the driving unit, and
resistance of the first resistor is smaller than resistance of the third resistor, and resistance of the second resistor is larger than resistance of the fourth resistor.

3. The inverter device according to claim 2, wherein the gate circuit further includes, for each of the switching circuits, a plurality of transistors configured to cause a short-circuit between the control terminal and an output terminal of the first switching element, and
the control unit controls the transistor to be turned on when a load of the converting circuit is in a low-load state different from a state in normal time.

4. The inverter device according to claim 1, wherein the control unit stops the first switching element being turned on and off when a load of the converting circuit is in a low-load state different from a state in normal time.

5. The inverter device according to claim 1, wherein the second switching element is formed by a wideband gap semiconductor.

6. The inverter device according to claim 5, wherein the wideband gap semiconductor is a silicon carbide or gallium nitride material or diamond.

7. An air conditioner comprising:
- an indoor unit including a ventilation fan configured to send out cooled or warmed air into a room; and
- an outdoor unit including a compressor configured to compress a refrigerant, a heat exchanger configured to carry out heat exchange between the refrigerant and outdoor air, and a fan configured to send the outdoor air into the heat exchanger, wherein
one motor or a plurality of motors among motors configured to drive the ventilation fan, the compressor, or the fan are driven to rotate by one inverter device or a plurality of inverter devices corresponding thereto;
each of the one inverter device or the plurality of inverter devices including,
- a rectifying circuit configured to rectify an alternating-current voltage output from an alternating-current power supply into a direct-current voltage;
- a smoothing capacitor configured to smooth the direct-current voltage rectified by the rectifying circuit;
- a converting circuit configured to convert the direct-current voltage smoothed by the smoothing capacitor into a desired alternating-current voltage; and
- a control unit configured to control the converting circuit, wherein
the converting circuit includes a plurality of switching circuits each including:
- a first switching element; and
- a second switching element connecting in parallel with the first switching element, having a conduction loss smaller than that of the first switching element and having switching speed higher than that of the first switching element, and
the control unit includes:
- a driving unit configured to generate a plurality of driving signals for respectively driving the switching circuits to be turned on and off; and
- a gate circuit configured to drive each of the switching circuits based on a corresponding one of the driving signals to turn on the second switching element later than the first switching element and turn off the first switching element later than the second switching element in said each switching circuit.

* * * * *